United States Patent
Ju

(10) Patent No.: US 7,180,784 B2
(45) Date of Patent: *Feb. 20, 2007

(54) PAGE BUFFER AND VERIFY METHOD OF FLASH MEMORY DEVICE USING THE SAME

(75) Inventor: Gi Seok Ju, Icheon-Si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 75 days.

This patent is subject to a terminal disclaimer.

(21) Appl. No.: 11/182,152

(22) Filed: Jul. 15, 2005

(65) Prior Publication Data

US 2006/0114723 A1 Jun. 1, 2006

(30) Foreign Application Priority Data

Nov. 30, 2004 (KR) ...................... 10-2004-0099445

(51) Int. Cl.
*G11C 16/06* (2006.01)
(52) U.S. Cl. ............................ 365/185.22; 365/185.12; 365/189.05
(58) Field of Classification Search ........... 365/185.22, 365/185.12, 189.05
See application file for complete search history.

(56) References Cited

U.S. PATENT DOCUMENTS 6,999,347 B2 * 2/2006 Mitani .................... 365/185.22

FOREIGN PATENT DOCUMENTS

KR 1029940050697 6/2004

OTHER PUBLICATIONS

Korean-language official action dated Mar. 22, 2006, issued by the Korean Intellectual Property Office in connection with the Korean priority application.

* cited by examiner

*Primary Examiner*—David Lam
(74) *Attorney, Agent, or Firm*—Marshall, Gerstein & Borun LLP

(57) ABSTRACT

Disclosed herein are a page buffer and a verify method of a flash memory device where the page buffer of a dual register structure includes a switch, which is driven according to a voltage level of an input terminal of a main latch, to output an erase-verify signal, and a switch, which is driven according to a voltage level of an output terminal of the main latch, to output a program-verify signal. Program-verify and erase-verify operations are performed using only the main latch. The disclosed page buffer and verify method can reduce verification time relative to devices using both a cache latch and a main latch.

11 Claims, 2 Drawing Sheets

PAGE BUFFER AND VERIFY METHOD OF FLASH MEMORY DEVICE USING THE SAME

BACKGROUND OF THE INVENTION

1. Field of the Disclosure

The present invention relates to NAND-type flash memory devices and, more specifically, to a page buffer of a dual register structure using only a main latch of a page buffer having a dual register, and a verify method using the same.

2. Description of Related Technology

There is an increasing demand for semiconductor memory devices which can be electrically programmed and erased, and that do not require a refresh function to rewrite data at a predetermined cycle. Furthermore, in order to develop large-capacity memory devices capable of storing a large quantity of data, research efforts into higher integration technologies of memory devices have been actively made. In this context, the program operation refers to an operation of writing data into memory cells, and the erase operation refers to an operation of erasing data written into memory cells.

For higher integration of memory devices, NAND-type flash memory devices have been developed in which a plurality of memory cells are connected in a serial manner (i.e., a structure in which neighboring cells share a source or drain) to form one string. The NAND-type flash memory devices are memory devices that read information in a sequential manner, unlike NOR-type flash memory devices. The program and erase operations of this NAND-type flash memory device are performed by controlling a threshold voltage of a memory cell while injecting or discharging electrons into or from a floating gate by way of F-N tunneling.

The NAND-type flash memory device employs a page buffer so as to store information of a large capacity or read stored information within a short time. The page buffer serves to receive data of a large capacity from an I/O pad, and then provide the received data to the memory cells, or to store data of the memory cells and then output the stored data. The page buffer is typically comprised of a single register in order to temporarily store data. In recent years, however, a dual register has been used in order to enhance the program speed of the NAND-type flash memory devices in connection with programming large-capacity data.

After an erase operation is performed in a NAND-type flash memory device having a page buffer of a dual register structure, a voltage of 0V is applied to word lines, and 0V is applied to an even bit line or an odd bit line that is not selected by an address, in order to carry out erase verification. For the purpose of erase verification, selected bit lines undergo erase verification through three stages of precharge, evaluation and sensing, in the same manner as a typical read operation.

For program and erase verification, however, after data pursuant to the status of a cell are stored in a cache latch, data stored in the cache latch are transferred to a main latch, which may be problematic. In addition, because erase verification also has to be performed using a PMOS transistor for program-verify, data opposite to the status of a cell are output upon erase verification.

SUMMARY OF THE INVENTION

In accordance with one aspect of the disclosure, a page buffer can perform program-verify and erase verification using only a main latch. A verify method using the page buffer is also disclosed. The disclosed page buffer may also or alternatively perform erase verification independently from program-verify operations.

In accordance with one embodiment of the disclosure, a page buffer includes a bit line selection unit for selectively connecting an even bit line or an odd bit line, which is connected to a memory cell array, to a sensing node according to a bit line selection signal. The page buffer further includes a first switch for precharging the even bit line or the odd bit line by supplying a predetermined voltage to the sensing node according to a precharge signal and a main register for storing state data of the selected cell according to a voltage level of the sensing node and a main latch signal. The page buffer still further includes a second switch for outputting an erase-verify signal according to a voltage level of a first terminal of the main register, and a third switch for outputting a program-verify signal according to a voltage level of a second terminal of the main register. The page buffer also includes a cache register for storing program data according to a control signal in a program operation, a fourth switch for transferring data stored in the cache register to the main register, and a fifth switch for programming the program data stored in the main register into the selected memory cell according to a program signal.

The bit line selection unit may include first and second NMOS transistors for discharging memory cells connected to the even bit line and the odd bit line, respectively, according to first and second discharge signals, and third and fourth NMOS transistors for connecting the even bit line or the odd bit line and the node, respectively, according to first and second bit line selection signals.

The first switch may include a PMOS transistor for supplying a power supply voltage to the sensing node according to the precharge signal.

The main register may include a latch for storing data depending upon the status of a selected cell of the memory cell array, a first NMOS transistor driven according to a voltage level of the sensing node, and a second NMOS transistor driven according to the main latch signal.

The main register may further include a NMOS transistor for initializing the latch according to an initialization signal.

The second switch may include a PMOS transistor that outputs a source voltage level or the erase-verify signal of a floating state according to the voltage level of the first terminal of the main register.

The third switch may include a PMOS transistor that outputs a source voltage level or the program-verify signal of a floating state according to the voltage level of the second terminal of the main register.

According to another aspect of the disclosure a verify method of a flash memory device includes the following steps: discharging a selected bit line for program or erase verification, and then initializing a main latch; precharging the selected bit line with a predetermined voltage level, and then evaluating a cell connected to the selected bit line; storing data depending upon the state of the selected memory cell in the main latch; outputting an erase-verify signal according to a voltage level of a first terminal of the main latch; and outputting a program-verify signal according to a voltage level of a second terminal of the main latch.

In some embodiments, state data of the selected cell maintains a low level if the cell is an erased state, and a high level if the cell is a programmed state. The erase-verify signal may maintain a floating state if the cell is in an erased state, and a high level if the cell is not in an erased state. The program-verify signal may maintain a high level if the cell is in a programmed state, and a floating state if the cell is not in a programmed state.

DETAILED DESCRIPTION OF PREFERRED EMBODIMENT

Described below are a number of preferred embodiments of the disclosure with reference to the accompanying drawings.

Figure 1:
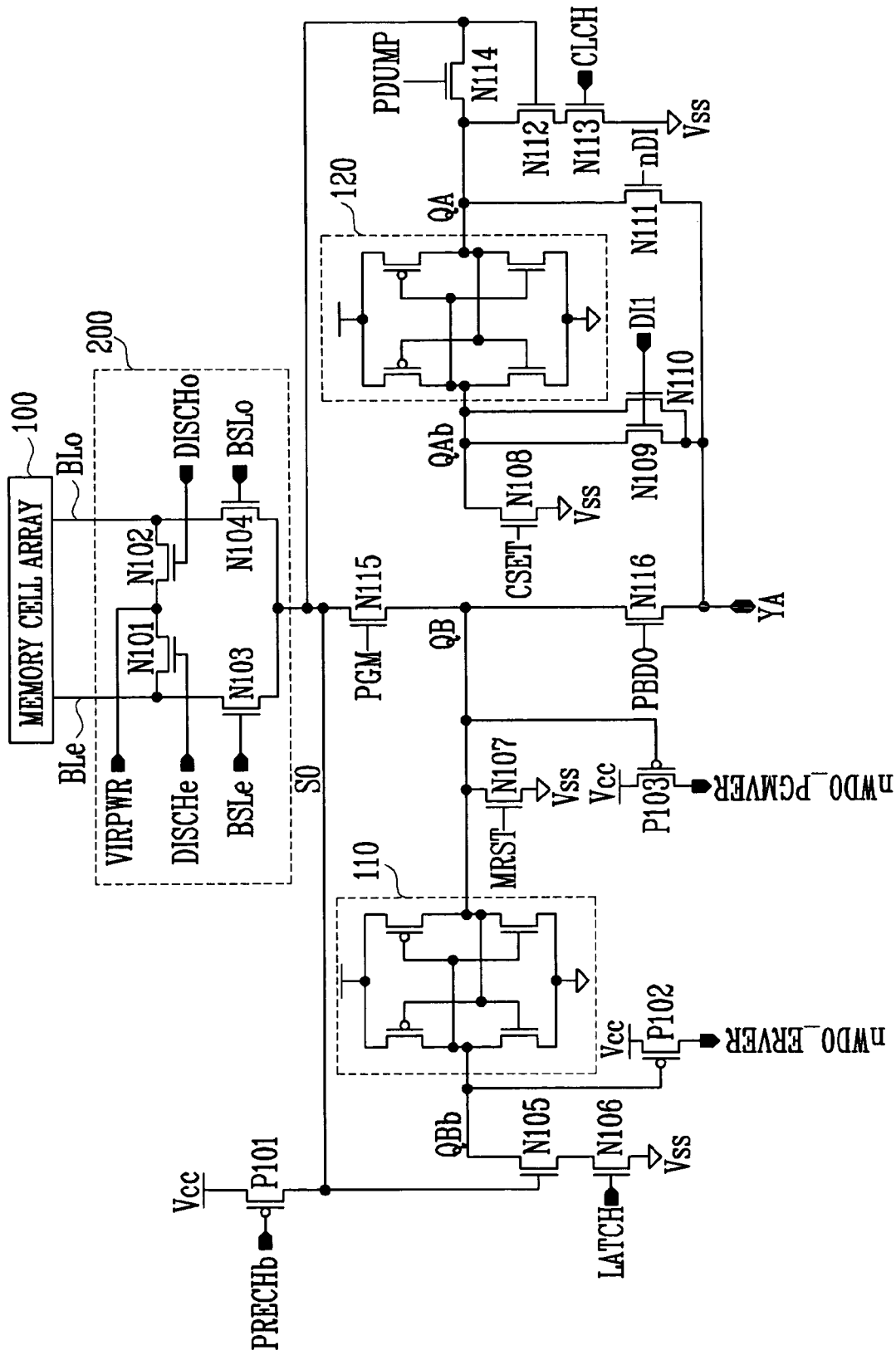
FIG. 1 is a circuit diagram of a page buffer according to one embodiment of the disclosure.

FIG. 1 is a circuit diagram of a page buffer according to one embodiment of the disclosure. The page buffer generally includes a cache register for receiving program data from the outside (i.e., an external source or supply) in a program operation, and a main register for storing data received from the cache register and for providing the stored data to a memory cell array 100 according to a bit line selection unit 200, in a program operation, or storing data depending upon the status of a memory cell in a verification operation.

NMOS transistors N101 and N102 of the bit line selection unit 200 are driven according to discharge signals DISCHe and DISCHo, respectively, to apply a voltage depending upon a signal VIRPWR to a memory cell of the memory cell array 100 that is connected to an even bit line BLe or an odd bit line BLo. Furthermore, NMOS transistors N103 and N104 of the bit line selection unit 200 are driven according to bit line selection signals BSLe and BSLo, respectively, to connect predetermined bit lines BLe and BLo of the memory cell array 100 to a page buffer.

A PMOS transistor P101 is driven according to a precharge signal PRECHb to apply a predetermined voltage to a node S0. A main latch 110 stores data depending upon the status of a predetermined cell of the memory cell array 100, or data externally supplied through a cache latch 120. A NMOS transistor N105 is driven according to a voltage level of the node S0, and a NMOS transistor N106 is driven according to a main latch signal LATCH to make a voltage level of a node QBb have a ground level. A NMOS transistor N107 is driven according to a main latch reset signal MRST to make a node QB have a ground voltage level, thus initializing the main latch 110. A PMOS transistor P102 is driven according to a voltage level of the node QBb to output an erase-verify signal nWDO_ERVER of a power supply voltage (Vcc) level. A PMOS transistor P103 is driven according to a voltage level of a node QB to output a program-verify signal nWDO_PGMVER of a power supply voltage (Vcc) level.

The cache latch 120 stores externally input data in connection with programming. A NMOS transistor N112 is driven according to a voltage level of the node S0, and a NMOS transistor N113 is driven according to a cache latch signal CLCH to make a voltage level of a node QA have a ground level. A NMOS transistor N108 is driven according to a cache register set signal CSET to make a node Qab have a ground voltage level, thus initializing the cache latch 120. NMOS transistors N109 and N110 are driven according to a signal DI1, which becomes active when data received from an I/O pad YA are logical "1" upon programming, and provides the "1" data to a node QAb. A NMOS transistor N111 is driven according to a signal nDI, which becomes active when data received from the I/O pad YA are logical "0" upon programming, and provides the "0" data to the node QA. A NMOS transistor N114 is driven according to a control signal PDUMP, thereby causing data stored in the cache latch 120 to be stored in the main latch 110.

A NMOS transistor N115 is driven according to a program signal PGM so that data to be programmed, which are stored in the main latch 110, are transmitted to a selected bit line in a program operation. A NMOS transistor N116 is driven according to a signal PBDO to output a voltage level of the node QB.

Program and erase verify methods using the page buffer described above are now described. If the discharge signal DISCHe is applied as a low level and the discharge signal DISCHo is applied as a high level, the NMOS transistor N101 is turned off, and the NMOS transistor N102 is turned on whereby the signal VIRPWR that is kept to 0V is supplied to the odd bit line BLo in a read operation. Accordingly, the even bit line BLe is selected, but the odd bit line BLo is not selected. Therefore, the main latch reset signal MRST is applied at a high level to turn on the NMOS transistor N107, thereby initializing the output terminal QB of the main latch 110 to a low level. The precharge signal PRECHb is then applied at a low level to turn on the PMOS transistor P101, so that the node SO stays high. Thereafter, as the bit line selection signal BSLe is applied at a voltage level of a first voltage V1, the selected bit line BLe is precharged with V1–Vt, and the bit line selection signal BSLe is applied at a low level to evaluate a cell. In this case, the word lines are all applied with 0V. Moreover, after the precharge signal PRECHb is applied as a high level to turn off the PMOS transistor P101, the bit line selection signal BSLe is applied as a voltage of a second voltage V2, and the main latch signal LATCH is applied at a high level to turn on the NMOS transistor N106. Accordingly, a voltage level of the node SO varies depending upon the status of a cell, and a voltage of the input terminal QBb and the output terminal QB of the main latch 110 varies accordingly. That is, in case of an erased cell, the node SO maintains a low level. In case of a programmed cell, the node SO keeps a high level. Therefore, in the case where the node SO keeps the low level, the NMOS transistor N105 is turned off, and a voltage level of the nodes QBb and QB does not change. Thus, the node QB maintains a low level.

On the contrary, in the case where the node SO maintains a high level, the NMOS transistor N105 is turned on and the transistor N106 is turned on. Thus, the node QBb reaches a low level, and the node QB reaches a high level. In other words, in case of an erased cell, the node QBb maintains a high level. In case of a programmed cell, the node QBb maintains a low level. Accordingly, the PMOS transistor P102 is driven according to a voltage level of the node QBb, and the erase-verify signal nWDO_ERVER of the power supply voltage (Vcc) level is thus output. In other words, in case of a successfully erased cell in an erase-verify operation, since the node QBb stays high, the PMOS transistor P102 is turned, and the erase-verify signal nWDO_ERVER maintains a floating state. In case of a non-successfully erased cell, because the node QBb stays low, the PMOS transistor P102 is turned on to output the erase-verify signal nWDO_ERVER at the high level. Meanwhile, a program-verify operation may be performed in the same manner as the above. The PMOS transistor P103 is driven according to a voltage level of the node QB to output the program-verify signal nWDO_PGMVER of the power supply voltage (Vcc) level, whereby the program-verify operation may be performed. That is, in case of a non-programmed cell, the node QB stays low, and the program-verify signal nWDO_PGMVER at a high level is output. In case of a programmed cell, the node QB maintains a high level, and the program-verify signal nWDO_PGMVER is thus floated.

Figure 2:
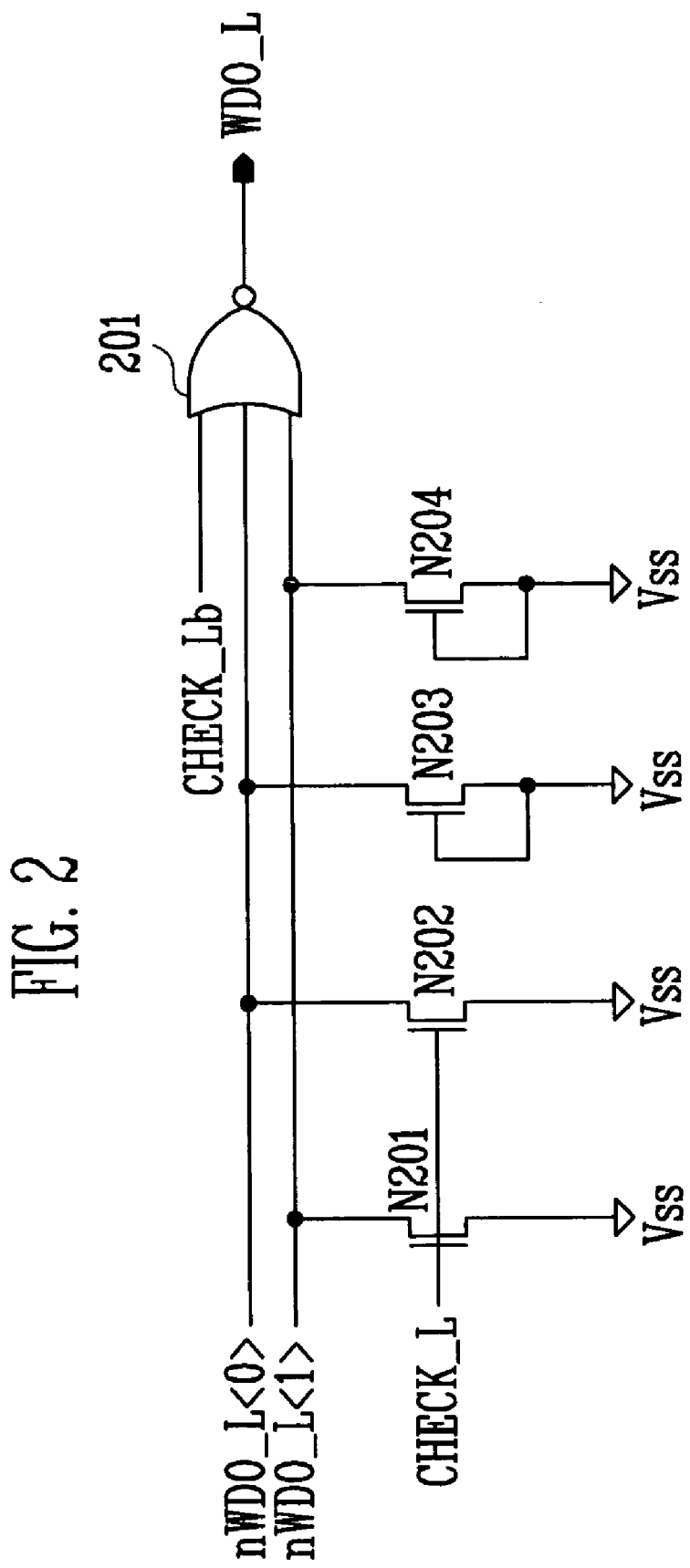
FIG. 2 is a circuit diagram of a verify circuit according to another embodiment of the disclosure.

FIG. 2 is a circuit diagram of a verify circuit according to one embodiment of the disclosure and including a NOR gate 210 for performing a NOR operation on a first verification signal nWDO_L<0> and a second verification signal nWDO_L<1> according to a verification enable bar signal CHECK_Lb, NMOS transistors N201 and N202 for controlling a voltage level of each of the first verification signal nWDO_L<0> and the second verification signal nWDO_L<1> to be a ground voltage level according to a verification enable signal CHECK_L, and NMOS transistors N203 and N204 that are diode-connected, for preventing abnormal rise of the first verification signal nWDO_L<0> and the second verification signal nWDO_L<1>. In this case, the first verification signal nWDO_L<0> is a verification signal of a first page buffer group consisting of a plurality of page buffers, and the second verification signal nWDO_L<1> is a verification signal of a second page buffer group consisting of a plurality of page buffers.

If the verification enable signal CHECK_L is applied at a high level, the verification enable bar signal CHECK_Lb is applied at a low level. Furthermore, in the case where the entire cells are normally erased in an erase-verify operation, the first verification signal nWDO_L<0> and the second verification signal nWDO_L<1> are floated. At this time, as the verification enable signal CHECK_L is applied at a high level, the NMOS transistors N201 and N202 are turned on. This makes the first verification signal nWDO_L<0> and the second verification signal nWDO_L<1> a low level. As a result, the NOR gate 210 outputs the verification pass signal nWDO_L at a high level.

As described above, a page buffer further includes a switch, which is driven according to a voltage level of an input terminal of a main latch, to output an erase-verify signal, and a switch, which is driven according to a voltage level of an output terminal of the main latch, to output a program-verify signal. Program-verify and erase-verify operations are also performed using only the main latch. Accordingly, the disclosed page buffer and verify method are advantageous in that verification time may be reduced relative to techniques using both a cache latch and a main latch.

Although the foregoing description has been made with reference to the preferred embodiments, it is to be understood that changes and modifications of the disclosed page buffer and verify method may be made by those skilled in the art without departing from the spirit and scope of the appended claims.

What is claimed is:

1. A page buffer, comprising:
   a bit line selection unit to selectively connect an even bit line or an odd bit line, which is connected to a memory cell array and to a sensing node according to a bit line selection signal;
   a first switch to precharge the even bit line or the odd bit line by supplying a predetermined voltage to the sensing node according to a precharge signal;
   a main register to store state data of the selected cell according to a voltage level of the sensing node and a main latch signal; a second switch to output an erase-verify signal according to a voltage level of a first terminal of the main register; a third switch to output a program-verify signal according to a voltage level of a second terminal of the main register; a cache register to store program data according to a control signal in a program operation; a fourth switch to transfer data stored in the cache register to the main register; and a fifth switch to program the program data stored in the main register into the selected memory cell according to a program signal.

2. The page buffer as claimed in claim 1, wherein the bit line selection unit includes:
   first and second NMOS transistors to discharge memory cells connected to the even bit line and the odd bit line, respectively, according to first and second discharge signals; and
   third and fourth NMOS transistors to connect the even bit line or the odd bit line and the node, respectively, according to first and second bit line selection signals.

3. The page buffer as claimed in claim 1, wherein the first switch includes a PMOS transistor to supply a power supply voltage to the sensing node according to the precharge signal.

4. The page buffer as claimed in claim 1, wherein the main register includes:
   a latch to store data depending upon a status of a selected cell of the memory cell array;
   a first NMOS transistor driven according to a voltage level of the sensing node; and
   a second NMOS transistor driven according to the main latch signal.

5. The page buffer as claimed in claim 4, wherein the main register further includes a NMOS transistor to initialize the latch according to an initialization signal.

6. The page buffer as claimed in claim 1, wherein the second switch includes a PMOS transistor that outputs a source voltage level or the erase-verify signal of a floating state according to the voltage level of the first terminal of the main register.

7. The page buffer as claimed in claim 1, wherein the third switch includes a PMOS transistor that outputs a source voltage level or the program-verify signal of a floating state according to the voltage level of the second terminal of the main register.

8. A verify method of a flash memory device, comprising the steps of:
   discharging a selected bit line for program or erase verification, and then initializing a main latch;
   precharging the selected bit line with a predetermined voltage level, and then evaluating a selected cell connected to the selected bit line;
   storing data depending upon the state of the selected memory cell in the main latch;
   outputting an erase-verify signal according to a voltage level of a first terminal of the main latch; and
   outputting a program-verify signal according to a voltage level of a second terminal of the main latch.

9. The verify method as claimed in claim 8, wherein state data of the selected cell maintains a low level if the selected cell is in an erased state, and a high level if the selected cell is in a programmed state.

10. The verify method as claimed in claim 8, wherein the erase-verify signal maintains a floating state if the selected cell is in an erased state, and a high level if the selected cell is not in an erased state.

11. The verify method as claimed in claim 8, wherein the program-verify signal maintains a high level if the selected cell is in a programmed state, and a floating state if the selected cell is not in a programmed state.

* * * * *

UNITED STATES PATENT AND TRADEMARK OFFICE
CERTIFICATE OF CORRECTION

| | |
|---|---|
| PATENT NO. | : 7,180,784 B2 |
| APPLICATION NO. | : 11/182152 |
| DATED | : February 20, 2007 |
| INVENTOR(S) | : Gi S. Ju |

It is certified that error appears in the above-identified patent and that said Letters Patent is hereby corrected as shown below:

On the First Page:
Item (*) Notice:
"This Patent is subject to a terminal Disclaimer" should be removed.

Signed and Sealed this

Twelfth Day of June, 2007

JON W. DUDAS
*Director of the United States Patent and Trademark Office*